(12) United States Patent
Porter

(10) Patent No.: US 6,740,957 B2
(45) Date of Patent: May 25, 2004

(54) SHALLOW TRENCH ANTIFUSE AND METHODS OF MAKING AND USING SAME

(75) Inventor: Stephen R. Porter, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/231,700

(22) Filed: Aug. 29, 2002

(65) Prior Publication Data

US 2004/0041233 A1 Mar. 4, 2004

(51) Int. Cl.$^7$ ............................................. H01L 29/00
(52) U.S. Cl. ........................ 257/530; 257/3; 257/4; 257/5; 257/594; 438/129; 438/131; 438/467; 438/694; 437/47
(58) Field of Search .............................. 438/129, 131, 438/467, 694; 437/47; 257/3, 4, 5, 594

(56) References Cited

U.S. PATENT DOCUMENTS

| | | | | |
|---|---|---|---|---|
| 5,208,177 A | * | 5/1993 | Lee | 438/239 |
| 6,228,437 B1 | | 5/2001 | Schmidt | 427/559 |
| 6,335,892 B1 | | 1/2002 | Shirley | 365/225.7 |
| 6,351,141 B2 | | 2/2002 | Mullarkey | 326/38 |
| 6,351,425 B1 | | 2/2002 | Porter | 365/225.7 |
| 6,392,284 B1 | | 5/2002 | Thakur et al. | 257/530 |
| 6,458,631 B1 | * | 10/2002 | Brintzinger et al. | 438/131 |

* cited by examiner

Primary Examiner—David Nelms
Assistant Examiner—Mai-Huong Tran
(74) Attorney, Agent, or Firm—Williams, Morgan & Amerson, P.C.

(57) ABSTRACT

The antifuse device comprises an insulating layer positioned in the trench, a conductive member positioned above the insulating layer, at least a portion of the conductive member being positioned within the trench, the conductive member adapted to have at least one programming voltage applied thereto, and at least one doped active region formed in the substrate adjacent the trench. The antifuse further comprises at least one conductive contact coupled to the conductive member, and at least one conductive contact coupled to the doped active region. In one illustrative embodiment, the method comprises forming a trench in a semiconducting substrate, forming at least one layer of insulating material in the trench, forming a conductive member in the trench above the at least one layer of insulating material, forming at least one doped active region in the substrate adjacent the trench, forming at least one conductive contact that is coupled to the conductive member and forming at least one conductive contact that is coupled to the at least one doped active region.

56 Claims, 5 Drawing Sheets

US 6,740,957 B2

SHALLOW TRENCH ANTIFUSE AND METHODS OF MAKING AND USING SAME

BACKGROUND OF THE INVENTION

1. Field of the Invention

The present invention is generally directed to the field of integrated circuits and semiconductor processing, and, more particularly, to a shallow trench antifuse formed in an integrated circuit device and methods of making and using same.

2. Description of the Related Art

A variety of different types of integrated circuit products are manufactured for use in a variety of different applications in today's technology-driven society. For example, a variety of different types of logic devices, e.g., microprocessors, application-specific integrated circuits ("ASICs"), etc., that are capable of executing a vast number of instructions per second are used in the control or operation of a variety of consumer products. Additionally, various types of memory devices, such as dynamic random-access memory devices ("DRAMs"), synchronous DRAMs ("SDRAMs") and static random-access memory devices ("SRAMs"), are employed in many modern products, and such memory devices are capable of storing millions of bits of digital information.

It is a common practice in the semiconductor industry to design and implement semiconductor devices that are capable of being permanently programmed to exhibit different operational properties or characteristics depending upon a selection process performed at some point during manufacture or testing of the device. Such a practice is common in connection with the design and manufacture of semiconductor memory devices. For example, it is common for a semiconductor memory device to be designed such that, during or after the fabrication process, the manufacturer has the option of selecting one of a plurality of input/output (I/O) configurations for the device. A memory device having a nominal 64 megabit capacity may be configured to have one of several I/O configurations: for example, a 16 megabit-by-four-bit ("×4") I/O configuration, where each row and column address pair references four bits at a time, or a 8 megabit-by-eight-bit ("×8") I/O configuration, where each row and column address pair references eight bits at a time, or a 4 megabit-by-sixteen-bit ("×16") configuration, where each row and column address pair references sixteen bits at a time. The selection of either the ×4, ×8, or the ×16 I/O option commonly involves the actuation ("blowing") of one or more one-time-programmable devices on the semiconductor device. Once the appropriate programmable devices are actuated, the device thereafter will permanently operate in accordance with the selected I/O configuration.

So-called "antifuses" are often used as one-time programmable devices in an integrated circuit product as a mechanism for changing the operating mode or configuration of the product. That is, antifuses are often used for the purpose of permitting the selection from among a plurality of programmable options for a semiconductor device. As those of ordinary skill in the art will appreciate, antifuses are essentially one-time programmable switching devices whose conductivity state (conductive or non-conductive) can be altered through application of predetermined programming signals or voltages to an integrated circuit's I/O pins. Most commonly, an antifuse is initially (i.e., at the time of fabrication) "open" or non-conductive. If it is desired to actuate or "blow" a particular antifuse to change an operational characteristic of the integrated circuit, one or more predetermined programming voltages may be applied to the antifuse via the integrated circuit's I/O pins. Once blown, the antifuse is rendered conductive. Further, once blown, it is typically not possible to reverse the programming. That is, once a fuse or antifuse has been blown, it cannot be un-blown.

Programmable options such as the I/O configuration of a memory device are often referred to as "fuse options" for the device. Those of ordinary skill in the art will appreciate that the I/O configuration of a memory device is but one example of the type of fuse options that may be available for a particular device. Fuse options may be available in connection with many different operational parameters of a semiconductor device, including, without limitation, the selection of certain internal timing parameters, the availability and activation of redundant rows or columns of memory cells in a memory device, the operational speed of a device, voltage regulation of a device, and so on. Providing a single semiconductor device with one or more fuse options is regarded as desirable, since a single design and fabrication process can be used to manufacture more than one class of end product. This flexibility eliminates the need for separate designs and separate fabrication processes to produce multiple classes of end product. Additionally, fuse options enable the manufacturer to counteract the effects of semiconductor process variations, advantageously increasing fabrication yield and maximizing production of higher-performance parts.

Antifuses may also be used to perform back end repairs of integrated circuits, i.e., repairs after the integrated circuit has been fabricated or packaged. Back end repairs of integrated circuits are typically accomplished by "blowing" antifuses to signal defective portions of the integrated circuit that they should be replaced with redundant circuits. For example, a row containing a defective memory cell in the array of a dynamic random access memory can be replaced with a redundant row of cells provided for that purpose.

Conventional antifuses may be similar in construction to capacitors in that they may include a pair of conductive plates separated by a dielectric or insulator material. Antifuses are typically characterized by the nature of the dielectric, which may be, for example, oxide, nitride or tantalum pentoxide. Antifuses are programmed or "blown" by applying a differential voltage between the plates that is sufficient to break down the dielectric, thereby establishing a conductive path between the conductive plates. Typically, this relatively high programming voltage is applied to the chip externally through terminals that are normally used for other purposes. For example, in a DRAM, a relatively high programming voltage may be applied to one of the data bit terminals after the integrated circuit has been placed in a programming mode by, for example, applying a predetermined combination of bits to other terminals of the integrated circuit.

The present invention is directed to an improved antifuse device and various methods that may solve, or at least reduce, some or all of the aforementioned problems.

SUMMARY OF THE INVENTION

The present invention is generally directed to a shallow trench antifuse and methods of making and using same. In one illustrative embodiment, the antifuse is comprised of an insulating layer positioned in the trench, a conductive member positioned above the insulating layer, at least a portion of the conductive member being positioned within the trench, the conductive member adapted to have at least one programming voltage applied thereto, and at least one doped active region formed in the substrate adjacent the trench. The antifuse further comprises at least one conductive contact coupled to the conductive member, and at least one conductive contact coupled to the doped active region. In further embodiments, the conductive member has an upper surface that is positioned below an upper surface of the substrate. In other embodiments, the conductive member has an upper surface that is positioned approximately planar with an upper surface of the substrate. In yet other embodiments, the conductive member has an upper surface that is positioned above an upper surface of the substrate. In various embodiments, the doped active region may surround the conductive member or the doped active region may be comprised of two separate, unconnected doped regions. In yet another illustrative embodiment, the doped active region is comprised of a single doped region positioned adjacent the trench.

The present invention is also directed to various methods. In one illustrative embodiment, the method comprises forming a trench in a semiconducting substrate, forming at least one layer of insulating material in the trench, forming a conductive member in the trench above the at least one layer of insulating material, forming at least one doped active region in the substrate adjacent the trench, forming at least one conductive contact that is coupled to the conductive member and forming at least one conductive contact that is coupled to the at least one doped active region. In further embodiments, the method further comprises applying a voltage to the conductive contact coupled to the doped active region and the conductive contact coupled to the conductive member to rupture the layer of insulating material and thereby establish a conductive path between the at least one doped active region and the conductive member. In even further embodiments, the method includes forming a first layer of insulating material, e.g., silicon dioxide, in the trench and then forming a layer of silicon nitride in the trench above the first layer of insulating material. A conductive member is then formed above the layer of silicon nitride.

BRIEF DESCRIPTION OF THE DRAWINGS

The invention may be understood by reference to the following description taken in conjunction with the accompanying drawings, in which like reference numerals identify like elements, and in which.

Figure 1A:
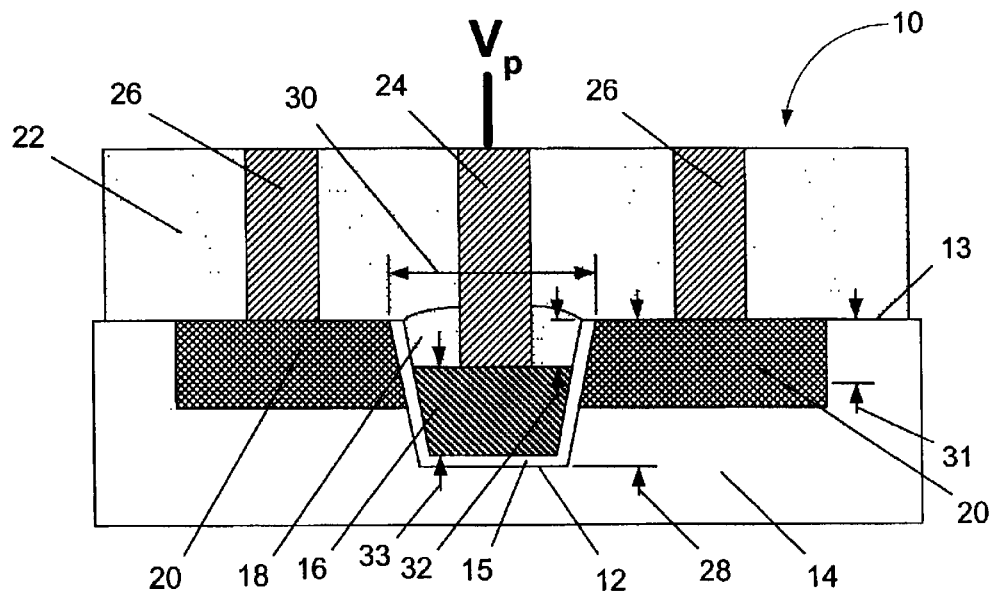
FIGS. 1A–1B are cross-sectional views of an antifuse in accordance with various illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1B:
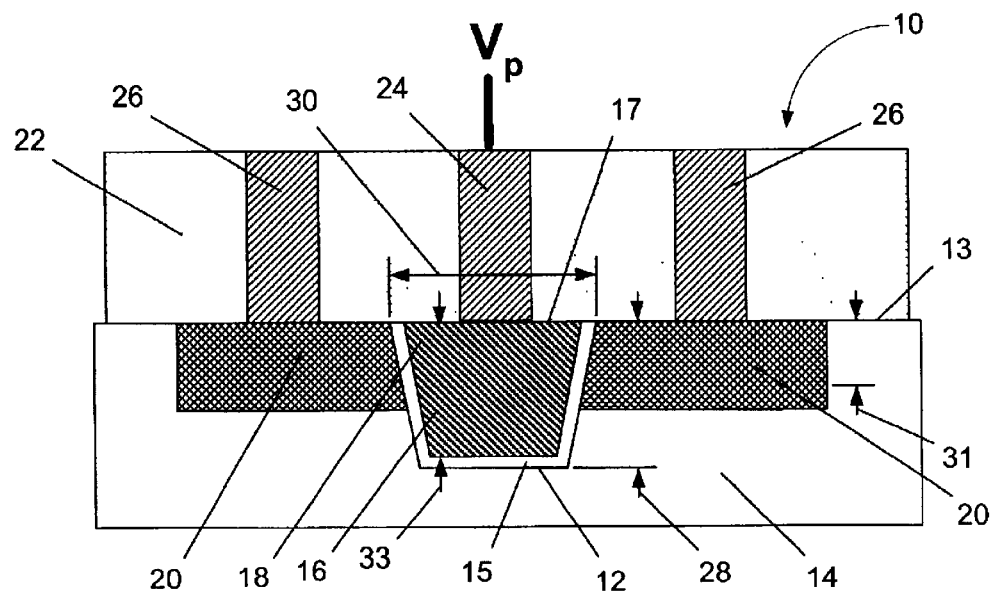
Figure 2A:
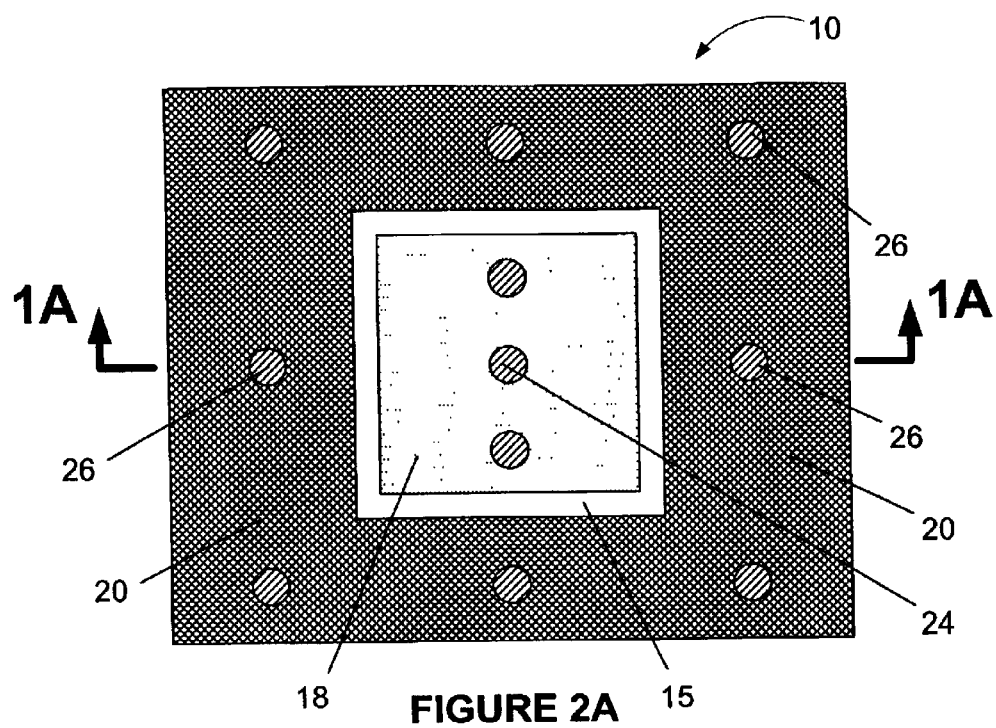
FIGS. 2A–2C are plan views of an antifuse in accordance with various illustrative embodiments of the present invention.
Figure 2B:
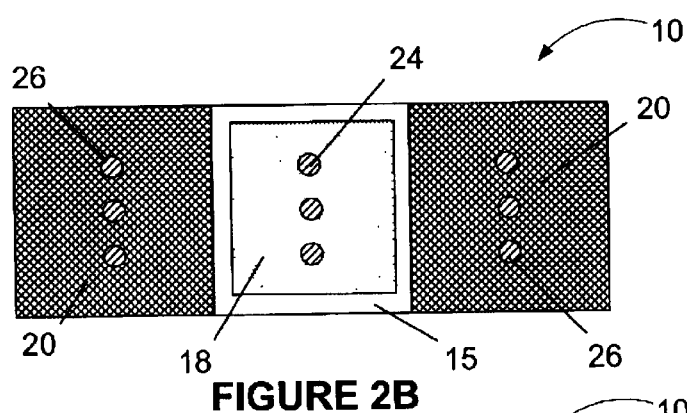
Figure 2C:
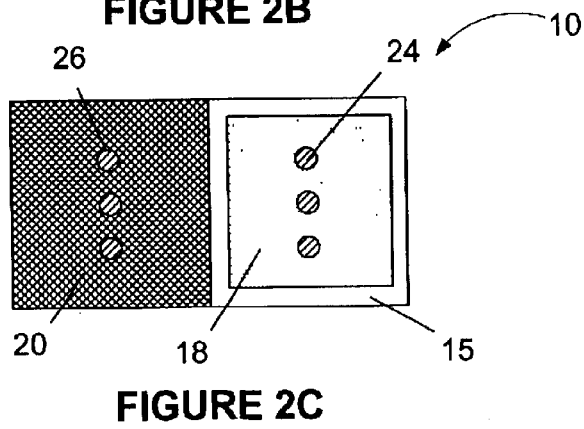

FIGS. 1A–1B are cross-sectional views of an antifuse 10 in accordance with various illustrative embodiments of the present invention. FIGS. 2A–2C are plan views of various illustrative embodiments of the antifuse 10. As shown in FIG. 1A, the antifuse 10 is formed in a trench 12 that is formed in a semiconducting substrate 14. The antifuse 10 is comprised of an insulating layer 15, a conductive member 16 and an insulating cap layer 18 positioned above the conductive member 16. In the depicted embodiment, the antifuse 10 is surrounded by a doped active region 20, although this is not required for all embodiments of the present invention. See FIG. 2A wherein the cross-sectional shading of the various components is continued for purposes of clarity. A plurality of contacts 24 are coupled to the conductive member 16, and a plurality of contacts 26 are conductively coupled to the active region 20. The conductive contacts 24, 26 are positioned in a layer of insulating material 22.

The physical dimensions and configuration of the trench 12 may vary. For example, in one illustrative embodiment, the trench 12 may have a depth 28 that ranges from approximately 200–500 nm (2000–5000 Å), and it may have a width 30 that ranges from approximately 100–200 nm (1000–2000 Å). Of course, the width 30 of the trench 12 may be increased if desired. The trench 12 may be formed by performing one or more known etching processes using an appropriate masking layer (not shown).

The insulating layer 15 may be comprised of a variety of materials and its thickness may also vary. For example, the insulating layer 15 may be comprised of silicon dioxide, or oxides of silicon, etc., and it may be formed by a variety of techniques, e.g., thermal growth, chemical vapor deposition ("CVD"), plasma enhanced chemical vapor deposition ("PECVD"), etc. The thickness of the insulating layer 15 may vary depending upon the programming voltages used. For example, the thickness of the insulating layer 15 may vary from approximately 1–10 nm (10–100 Å). In one illustrative embodiment, the insulating layer 15 is comprised of a thermally grown layer of silicon dioxide having a thickness of approximately 5–6 nm (50–60 Å). In an alternative embodiment, the insulating layer 15 may be a combination of two or more layers of material. For example, a first layer of silicon dioxide (not shown) may be formed on the silicon surfaces in the trench 12 to a thickness of approximately 9–11 nm (90–110 Å), and a second layer comprised of silicon nitride may be formed on the first layer having a thickness of approximately 5.5–7.5 nm (55–75 Å). In even further embodiments, the layer of silicon dioxide may have a thickness on the order of 1 nm (10 Å). The layer of silicon dioxide may be formed by a thermal growth process, and the layer of silicon nitride may be formed by a deposition process.

The conductive member 16 may be comprised of a variety of conductive materials, such as polysilicon (doped or undoped), a metal, e.g., copper, aluminum, titanium, a metal silicide, e.g., cobalt silicide, amorphous silicon, or other like materials. The conductive member 16 may be formed by a variety of techniques, e.g., CVD, PECVD, physical vapor deposition ("PVD"), electroplating, etc. The conductive member 16 has a thickness 33 that may vary from, for example, approximately 2000–6000 nm. In one illustrative embodiment, the conductive member 16 is comprised of a doped polysilicon having a thickness 33 of approximately 3000 nm that is formed by a CVD process.

The insulating cap layer 18 may also be comprised of a variety of materials, such as silicon dioxide, boron phosphosilicate glass (BPSG), etc., and it may be formed by a variety of techniques, e.g., CVD, PECVD, etc. The insulating cap layer 18 may extend beneath the surface 13 of the substrate 14 by a depth 32 that ranges from approximately 1–400 nm (10–4000 Å). In one illustrative embodiment, the insulating cap layer 18 is comprised of silicon dioxide, and it has a depth 32 of approximately 200 nm (2000 Å).

FIG. 1B is a cross-sectional view of an alternative embodiment of the present invention. As shown therein, the insulating cap layer 18 may be omitted from the antifuse 10 and the conductive member 16 may be formed such that its upper surface 17 is substantially planar with the surface 13 of the substrate 14. In other embodiments, not depicted in the drawings, the upper surface 17 of the conductive member 16 may actually extend above the surface 13 of the substrate 14. In FIG. 1B, the thickness 33 of the conductive member 16 corresponds approximately to the depth 28 of the trench 12 less the thickness of the insulating layer 15.

In the depicted embodiments, the doped active region 20 is formed by implanting the appropriate dopant atoms into the substrate 14. The type, species and dose of dopant atoms implanted into the substrate 14 to form the active region 20 may vary depending upon the particular application. For example, N-type dopant materials, such as phosphorous (P) or arsenic (Ar), or P-type dopant materials, such as boron (B) or boron difluoride ($BF_2$), may be implanted into the substrate 14. This will result in the doped regions 20 having a dopant concentration that ranges from approximately $1e^{18}$–$1e^{19}$ ions/cm$^3$. The energy level of the ion implant process performed to implant the dopant material will vary depending upon the particular dopant species employed. For example, for N-type dopant materials, the implant energy may range from approximately 8–12 keV. For P-type dopant materials, the implant energy may range from approximately 5–10 keV. The implant process should be performed such that the peak concentration of the doped region 20 extends for a depth 31 beneath the surface 13 of the substrate 14 that ranges from approximately 10–200 nm (100–2000 Å). More particularly, for the embodiment of the antifuse 10 depicted in FIG. 1A, the peak concentration depth 31 of the active region 20 should be greater than the depth 32 of the insulating cap layer 18 by at least approximately 10–200 nm (100–2000 Å).

The layer of insulating material 22 may be comprised of a variety of materials, e.g., silicon dioxide, boron phosphosilicate glass (BPSG), etc., and its thickness may vary from, for example, 500–1000 nm (5000–10000 Å). The layer of insulating material 22 may be formed by a variety of techniques, such as CVD, PECVD, etc. The conductive contacts 24, 26 may be comprised of a variety of different conductive materials, e.g., copper, aluminum, tungsten, etc. The conductive contacts 24, 26 may be formed in the insulating layer 22 by a variety of known techniques. The conductive contacts 24 are electrically coupled to the conductive member 18. The conductive contacts 26 are electrically coupled to the active region 20. The size, number, spacing and configuration of the contacts 24, 26 may vary depending upon the particular application.

As shown in FIGS. 2A–2C, the antifuse 10 is positioned adjacent the active region 20 formed in the substrate 14. As shown in FIG. 2A, the antifuse 10 is positioned within, and surrounded by, the active region 20, and both the active region 20 and the antifuse 10 have generally rectangular configurations. In FIG. 2B, the active region 20 is comprised of two unconnected doped regions positioned on opposite sides of the antifuse 10. In FIG. 2C, the active region 20 is comprised of a single doped region 20 positioned adjacent the antifuse 10. However, the present invention should not be considered as limited to the particular embodiments or configurations shown in the attached drawings unless such limitations are expressly set forth in the appended claims. Rather, as will be recognized by those skilled in the art after a complete reading of the present application, the configuration, size and relative location of the antifuse 10 and active region 20 may vary depending upon the particular application.

Figure 3A:
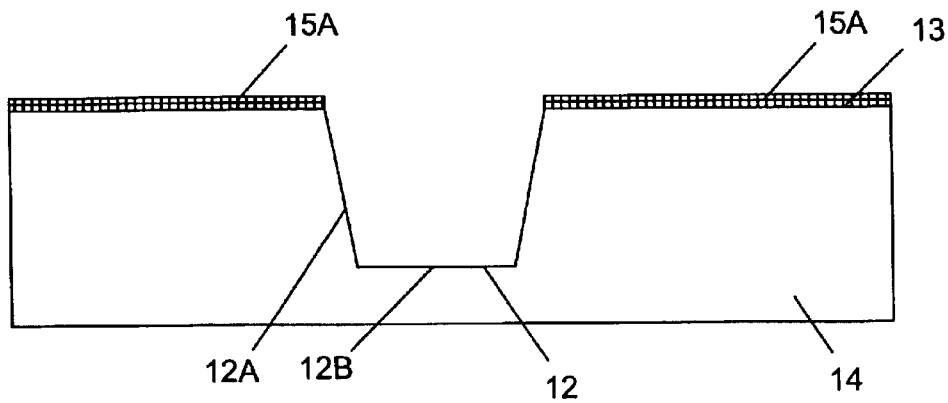
FIGS. 3A–3H are illustrative process flows for forming the antifuse 10 depicted in FIG. 1A.

The antifuse of the present invention may be formed in accordance with a variety of process flows. For example, one embodiment of an illustrative process flow for forming the antifuse 10 depicted in FIG. 1A is described in FIGS. 3A–3F. As shown in FIG. 3A, the trench 12 is formed in the substrate 14 by performing one or more known etching processes. A masking layer 15A comprised of, for example, silicon nitride, may be formed above the substrate 14 and patterned prior to forming the trench 12. Alternatively, a photoresist mask (not shown) could be used during the etching process used to form the trench 12.

Figure 3B:
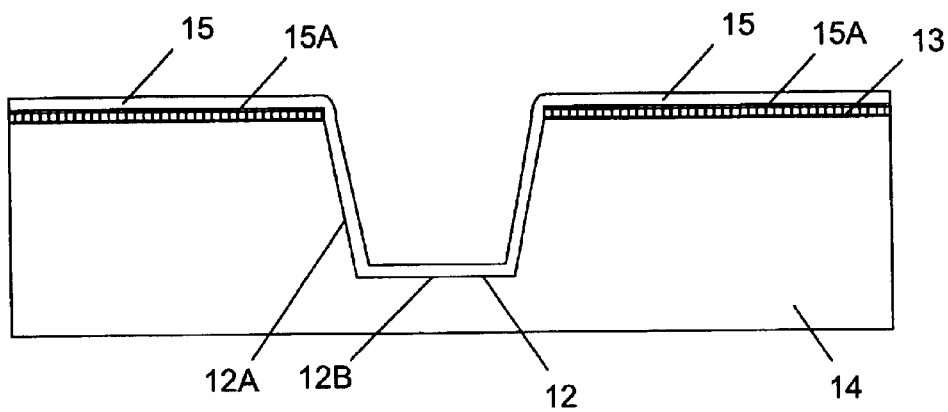

Next, as shown in FIG. 3B, the insulating layer 15 is formed at least in the trench 12. In the embodiment depicted in FIG. 3B, the insulating layer 15 is conformally deposited above the mask layer 15A and in the trench 12 by, for example, a CVD process. Alternatively, a thermal growth process may be performed such that the insulating layer 15 only forms on the exposed sidewalls 12A and bottom 12B of the trench 12, although that situation is not depicted in FIG. 3B.

Figure 3C:
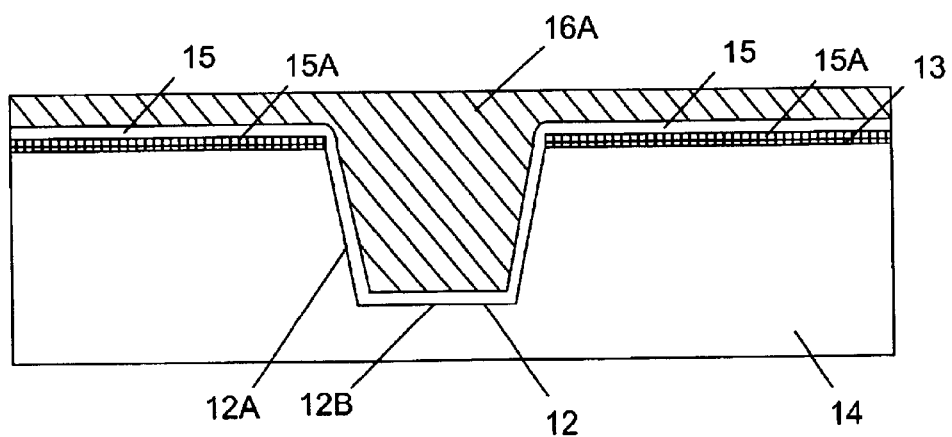
Figure 3D:
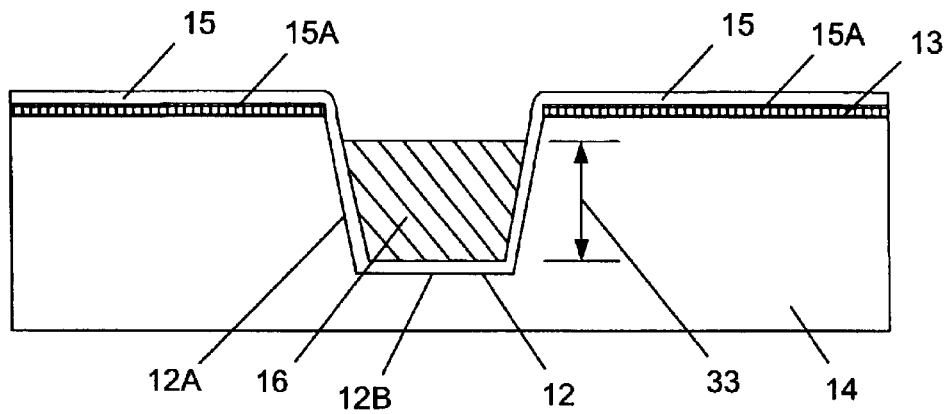
Figure 3E:
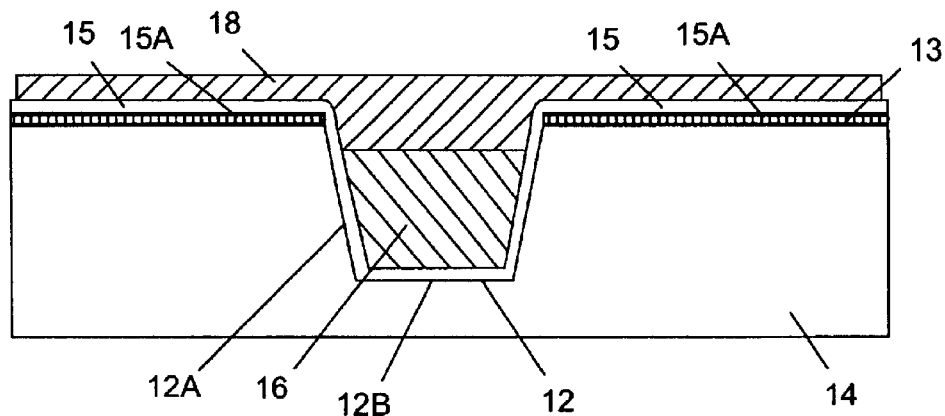
Figure 3F:
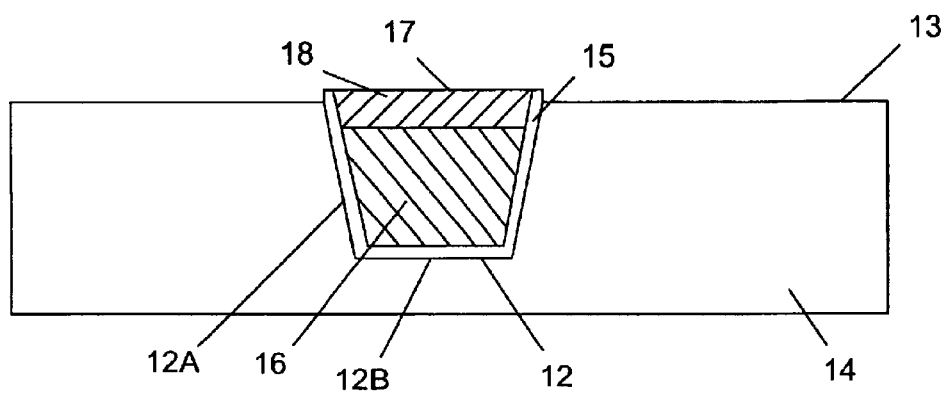

Thereafter, as shown in FIG. 3C, a layer of conductive material 16A is deposited in the trench 12 above the insulating layer 15. Then, an etching process is performed to remove the portions of the conductive layer 16A positioned outside of the trench 12 until such time that only the desired thickness 33 of the conductive member 16 is reached, as indicated in FIG. 3D. The portions of the layer of conductive material 16A may be removed by performing any of a variety of known anisotropic or isotropic etching processes, or by a chemical mechanical polishing process.

After the conductive member 16 is formed, the insulating cap layer 18 may be deposited above the conductive member 16. Then, a chemical mechanical polishing process may be performed to remove the excess quantity of insulating material from above the surface of the mask layer 15A. After this is accomplished, the mask layer 15A may be removed by a wet etching process that is selective with respect to the insulating layer 15 and the insulating cap layer 18 to thereby result in the structure depicted in FIG. 3F.

The embodiment of the antifuse 10 depicted in FIG. 1B may be formed by initially performing substantially the same process steps depicted in FIGS. 3A–3C. Thus, the description of the process flow to that point will not be repeated. The different steps that may be performed to form the antifuse 10 depicted in FIG. 1B will now be described with reference to FIGS. 3G–3H.

Figure 3G:
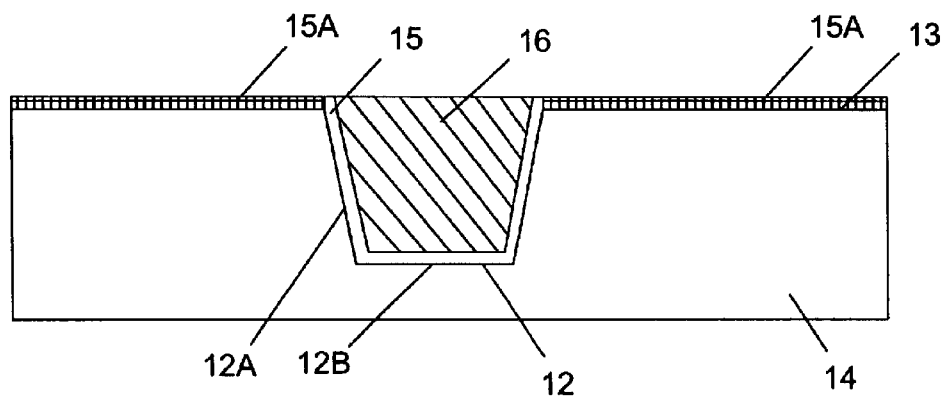
Figure 3H:
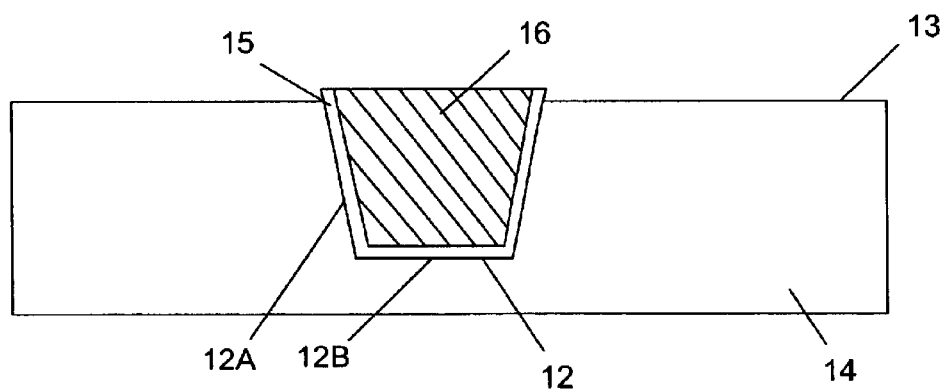

As shown in FIG. 3G, after the trench 12 is filled with the layer of conductive material 16A, a chemical mechanical polishing process may be performed to remove the excess material positioned above the masking layer 15A. Then, as shown in FIG. 3H, a selective etching process is performed to remove the masking layer 15A. If desired, another CMP process may be performed such that the surface 17 of the conductive member 16 is approximately planar with the surface 13 of the substrate 14. Alternatively, this last CMP process may be omitted and the conductive member 16 may extend above the surface 13 of the substrate 14.

In operation, one or more programmable voltages ($V_P$) may be applied to the antifuse 10 to rupture the insulating layer 15 to thereby establish a conductive path between the conductive contacts 26 coupled to the active region 20 and the conductive contacts 24 coupled to the conductive member 16. More generally, by applying one or more programming voltages ($V_P$) to the conductive member 16, a conductive path is established between circuitry (not shown) coupled to the contacts 26 and circuitry (not shown) coupled to the contacts 24.

The programming voltage(s) ($V_P$) may be a voltage at a level that is significantly above the highest operating voltage on the integrated circuits. For example, for integrated circuits where the highest circuit voltage is +5V, the programming voltage ($V_P$) may be approximately 7–12V. The programming voltage will scale with the thickness of the layer of insulating material 15. The programming voltage ($V_P$) may be applied to blow the antifuse 10 before or after the packaging of the integrated circuit product. When the programming voltages are applied, additional circuitry (not shown) may be provided in accordance with customary practice to insure that the relatively high programming voltage is not applied to areas of the integrated circuit where it may damage sensitive circuits, i.e., care is taken to insure that the programming voltage is only applied to the antifuse 10.

The present invention is also directed to various methods. In one illustrative embodiment, the method comprises forming a trench in a semiconducting substrate, forming at least one layer of insulating material in the trench, forming a conductive member in the trench above the at least one layer of insulating material, forming at least one doped active region in the substrate adjacent the trench, forming at least one conductive contact that is coupled to the conductive member and forming at least one conductive contact that is coupled to the at least one doped active region. In further embodiments, the method further comprises applying a voltage to the conductive contact coupled to the doped active region and the conductive contact coupled to the conductive member to rupture the layer of insulating material and thereby establish a conductive path between the at least one doped active region and the conductive member. In even further embodiments, the method includes forming a first layer of insulating material, e.g., silicon dioxide, in the trench and then forming a layer of silicon nitride in the trench above the first layer of insulating material. A conductive member is then formed above the layer of silicon nitride.

In another illustrative embodiment, the present invention is directed to a method in which the antifuse of the present invention is coupled to a programming voltage to thereby cause the insulating layer to rupture, thereby rendering the antifuse conductive. The programming voltage may be applied to either the conductive member positioned in the trench or to the contacts coupled to the doped active region (s) positioned adjacent the trench.

In an even more specific embodiment, a redundant row (or column) decoder circuit may be employed in combination with the antifuse disclosed herein. That is, the present invention may involve a decoding circuit that is adapted to decode address signals to select a redundant row or column in which the antifuse of the present invention is coupled to the decoding circuit. The antifuse is programmable from an open circuit condition to a closed circuit condition to thereby render the decoding circuit responsive to appropriate address signals to activate the redundant row or column.

The present invention may be employed in a wide variety of integrated circuit products, such as memory devices, logic devices, etc. That is, an integrated circuit comprising one or more of the inventive antifuses 10 disclosed herein may be readily programmed for a variety of different physical and functional characteristics as dictated by, for example, consumer demand or manufacturing requirements. As a more specific example, various embodiments of the antifuse 10 disclosed herein may be employed with various memory devices to enable selection of a desired I/O configuration and/or to enable defective circuits, or portions thereof, to be replaced with redundant replacement circuits.

The present invention is generally directed to a shallow trench antifuse and methods of making and using same. In one illustrative embodiment, the antifuse device comprises an insulating layer 15 positioned in the trench 12, a conductive member 16 positioned above the insulating layer 15, at least a portion of the conductive member 16 being positioned within the trench 12, the conductive member 16 being adapted to have at least one programming voltage ($V_P$) applied thereto, and at least one doped active region 20 formed in the substrate 14 adjacent the trench 12. The antifuse further comprises at least one conductive contact 24 coupled to the conductive member 16, and at least one conductive contact 26 coupled to the doped active region 20. In further embodiments, the conductive member 16 has an upper surface 17 that is positioned below an upper surface 13 of the substrate 14. In other embodiments, the conductive member 16 has an upper surface 17 that is positioned approximately planar with an upper surface 13 of the substrate 14. In yet other embodiments, the conductive member 16 has an upper surface 17 that is positioned above an upper surface 13 of the substrate 14. In various embodiments, the doped active region 20 may surround the conductive member 16 or the doped active region 20 may be comprised of two separate, unconnected doped regions. In yet another illustrative embodiment, the doped active region 20 is comprised of a single doped region positioned adjacent the trench 12.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An antifuse formed in a trench in a semiconducting substrate, comprising:
   an insulating layer positioned in said trench;
   a conductive member positioned above said insulating layer, at least a portion of said conductive member being positioned within said trench, said conductive member adapted to have at least one programming voltage applied thereto;
   at least one doped active region formed in said substrate adjacent said trench;
   at least one conductive contact coupled to said conductive member; and
   at least one conductive contact coupled to said doped active region.

2. The antifuse of claim 1, wherein said insulating layer is comprised of at least one of silicon dioxide, silicon nitride and oxides of silicon.

3. The antifuse of claim 1, wherein said insulating layer is comprised of at least two layers of material.

4. The antifuse of claim 1, wherein said insulating layer is comprised of at least two layers of material, a first of said layers being comprised of silicon dioxide, and a second of said layers being comprised of silicon nitride, said second layer being formed on said first layer.

5. The antifuse of claim 1, wherein said insulating layer has a thickness ranging from approximately 1–10 nm.

6. The antifuse of claim 1, wherein said conductive member is comprised of at least one of polysilicon, a metal and an amorphous silicon.

7. The antifuse of claim 1, wherein said conductive member has an upper surface that is positioned below an upper surface of said substrate.

8. The antifuse of claim 1, wherein said conductive member has an upper surface that is positioned approximately planar with an upper surface of said substrate.

9. The antifuse of claim 1, wherein said conductive member has an upper surface that is positioned above an upper surface of said substrate.

10. The antifuse of claim 7, further comprising a capping layer of insulating material positioned above said upper surface of said conductive member, at least a portion of said capping layer of insulating material being positioned in said trench.

11. The antifuse of claim 1, wherein said at least one doped active region is doped with at least one of an N-type dopant material and a P-type dopant material.

12. The antifuse of claim 1, wherein said at least one doped active region surrounds said conductive member.

13. The antifuse of claim 1, wherein said at least one doped active region is comprised of two separate doped regions.

14. The antifuse of claim 1, wherein said at least one doped active region is comprised of a single doped region positioned adjacent said trench.

15. The antifuse of claim 1, wherein said at least one doped region has a peak concentration depth that ranges from approximately 10–200 nm.

16. The antifuse of claim 1, wherein said at least one doped region has a concentration of dopant ions that ranges from approximately $1e^{18}$–$1e^{19}$ ions/cm$^3$.

17. The antifuse of claim 1, wherein said conductive member has an upper surface that is positioned below an upper surface of said substrate and said at least one doped region has a peak concentration depth that is below said upper surface of said conductive member.

18. An antifuse formed in a trench in a semiconducting substrate, comprising:
   an insulating layer positioned in said trench;
   a conductive member positioned in said trench above said insulating layer, wherein said conductive member has an upper surface that is positioned below an upper surface of said substrate, said conductive member adapted to have at least one programming voltage applied thereto;
   at least one doped active region formed in said substrate adjacent said trench;
   at least one conductive contact coupled to said conductive member; and
   at least one conductive contact coupled to said doped active region.

19. The antifuse of claim 18, wherein said insulating layer is comprised of at least one of silicon dioxide and oxides of silicon.

20. The antifuse of claim 18, wherein said insulating layer is comprised of at least two layers of material.

21. The antifuse of claim 18, wherein said insulating layer is comprised of at least two layers of material, a first of said layers being comprised of silicon dioxide, and a second of said layers being comprised of silicon nitride, said second layer being formed on said first layer.

22. The antifuse of claim 18, wherein said insulating layer has a thickness ranging from approximately 1–10 nm.

23. The antifuse of claim 18, wherein said conductive member is comprised of at least one of polysilicon, a metal and an amorphous silicon.

24. The antifuse of claim 18, further comprising a capping layer of insulating material positioned above said upper surface of said conductive member, at least a portion of said capping layer of insulating material being positioned in said trench.

25. The antifuse of claim 18, wherein said at least one doped active region is doped with at least one of an N-type dopant material and a P-type dopant material.

26. The antifuse of claim 18, wherein said at least one doped active region surrounds said conductive member.

27. The antifuse of claim 18, wherein said at least one doped active region is comprised of two separate doped regions.

28. The antifuse of claim 18, wherein said at least one doped active region is comprised of a single doped region positioned adjacent said trench.

29. The antifuse of claim 18, wherein said at least one doped region has a peak concentration depth that ranges from approximately 10–200 nm.

30. The antifuse of claim 18, wherein said at least one doped region has a concentration of dopant ions that ranges from approximately $1e^{18}$–$1e^{19}$ ions/cm$^3$.

31. The antifuse of claim 18, wherein said at least one doped region has a peak concentration depth that is below said upper surface of said conductive member.

32. An antifuse formed in a trench in a semiconducting substrate, comprising:

an insulating layer positioned in said trench;

a conductive member positioned in said trench above said insulating layer, wherein said conductive member has an upper surface that is positioned approximately planar with or above an upper surface of said substrate, said conductive member adapted to have at least one programming voltage applied thereto;

at least one doped active region formed in said substrate adjacent said trench;

at least one conductive contact coupled to said conductive member; and at least one conductive contact coupled to said doped active region.

33. The antifuse of claim 32, wherein said insulating layer is comprised of at least one of silicon dioxide and oxides of silicon.

34. The antifuse of claim 32, wherein said insulating layer is comprised of at least two layers of material.

35. The antifuse of claim 32, wherein said insulating layer is comprised of at least two layers of material, a first of said layers being comprised of silicon dioxide, and a second of said layers being comprised of silicon nitride, said second layer being formed on said first layer.

36. The antifuse of claim 32, wherein said insulating layer has a thickness ranging from approximately 1–10 nm.

37. The antifuse of claim 32, wherein said conductive member is comprised of at least one of polysilicon, a metal and an amorphous silicon.

38. The antifuse of claim 32, wherein said at least one doped active region is doped with at least one of an N-type dopant material and a P-type dopant material.

39. The antifuse of claim 32, wherein said at least one doped active region surrounds said conductive member.

40. The antifuse of claim 32, wherein said at least one doped active region is comprised of two separate doped regions.

41. The antifuse of claim 32, wherein said at least one doped active region is comprised of a single doped region positioned adjacent said trench.

42. The antifuse of claim 32, wherein said at least one doped region has a peak concentration depth that ranges from approximately 10–200 nm.

43. The antifuse of claim 32, wherein said at least one doped region has a concentration of dopant ions that ranges from approximately $1e^{18}$–$1e^{19}$ ions/cm$^3$.

44. An integrated circuit device, comprising:

an antifuse formed in a trench in a semiconducting substrate, said antifuse comprising:

an insulating layer positioned in said trench;

a conductive member positioned above said insulating layer, at least a portion of said conductive member being positioned within said trench, said conductive member adapted to have at least one programming voltage applied thereto;

at least one doped active region formed in said substrate adjacent said trench;

at least one conductive contact coupled to said conductive member; and at least one conductive contact coupled to said doped active region.

45. The integrated circuit device of claim 44, wherein said conductive member is comprised of at least one of polysilicon, a metal and an amorphous silicon.

46. The integrated circuit device of claim 44, wherein said conductive member has an upper surface that is positioned below an upper surface of said substrate.

47. The integrated circuit device of claim 44, wherein said conductive member has an upper surface that is positioned approximately planar with an upper surface of said substrate.

48. The integrated circuit device of claim 44, wherein said conductive member has an upper surface that is positioned above an upper surface of said substrate.

49. The integrated circuit device of claim 46, further comprising a capping layer of insulating material positioned above said upper surface of said conductive member, at least a portion of said capping layer of insulating material being positioned in said trench.

50. The integrated circuit device of claim 44, wherein said at least one doped active region is doped with at least one of an N-type dopant material and a P-type dopant material.

51. The integrated circuit device of claim 44, wherein said at least one doped active region surrounds said conductive member.

52. The integrated circuit device of claim 44, wherein said at least one doped active region is comprised of two separate doped regions.

53. The integrated circuit device of claim 44, wherein said at least one doped active region is comprised of a single doped region positioned adjacent said trench.

54. The integrated circuit device of claim 44, wherein said at least one doped region has a peak concentration depth that ranges from approximately 10–200 nm.

55. The integrated circuit device of claim 44, wherein said at least one doped region has a concentration of dopant ions that ranges from approximately $1e^{18}$–$1e^{19}$ ions/cm$^3$.

56. The integrated circuit device of claim 44, wherein said conductive member has an upper surface that is positioned below an upper surface of said substrate and said at least one doped region has a peak concentration depth that is below said upper surface of said conductive member.

* * * * *